United States Patent [19]
Liu

[11] Patent Number: 6,110,794
[45] Date of Patent: Aug. 29, 2000

[54] SEMICONDUCTOR HAVING SELF-ALIGNED, BURIED ETCH STOP FOR TRENCH AND MANUFACTURE THEREOF

[75] Inventor: Albert H. Liu, San Antonio, Tex.

[73] Assignee: Philips Semiconductors of North America Corp., Tarrytown, N.Y.

[21] Appl. No.: 09/136,459

[22] Filed: Aug. 19, 1998

[51] Int. Cl.$^7$ .................................................. H01L 21/302
[52] U.S. Cl. ............................................ 438/407; 438/423
[58] Field of Search .................................... 438/407, 423, 438/FOR 158, FOR 227

[56] References Cited

U.S. PATENT DOCUMENTS 3,622,382  11/1971  Brack et al. .

OTHER PUBLICATIONS

Stoev et al, "Formation of etch–stop structures utilizing ion–beam synthesized buried oxide and nitride layers in silicon", Elsevier Sequoia, pp. 183–195, 1989.

S. Wolf, "Silicon Processing for the VLSI Era", Lattice Press, vol. I, pp. 547–555 and 567, 1990.

Stanley Wolf, Ph.D., Silicon Processing for the VLSI Era, vol. 2: *Process Integration*, 1990, pp. 105–106.

*Primary Examiner*—George Fourson
*Assistant Examiner*—Joannie A. Garcia

[57] ABSTRACT

A semiconductor fabrication process uses a buried, oxygen-rich layer as a stop etch in a trench isolation area, with minimal masking. According to one embodiment, the process involves applying a mask to protect selected portions of a silicon-based substrate, and then using the mask to implant an oxygen-based substance into unmasked portions of the substrate, thereby forming a buried oxygen layer at a selected depth within the substrate. The same mask is then used in an etching process to form the desired trench structure. The depth of the trench is defined as a result of terminating the etch process upon reaching the buried oxygen layer.

11 Claims, 2 Drawing Sheets

SEMICONDUCTOR HAVING SELF-ALIGNED, BURIED ETCH STOP FOR TRENCH AND MANUFACTURE THEREOF

FIELD OF THE INVENTION

This invention relates to semiconductor devices and their manufacture and, more particularly, to such devices incorporating, and processes for developing, silicon trenches.

BACKGROUND OF THE INVENTION

The electronics industry continues to rely upon advances in semiconductor technology to realize higher-functioning devices in more compact areas, For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS) and complimentary MOS (CMOS) transistors, bipolar transistors, BiCMOS transistors, etc.

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

One important step in the manufacture of such devices is the formation of isolation areas to electrically separate electrical components, or portion thereof, that are closely integrated in the silicon wafer. Isolation areas are often implemented using a shallow trench isolation (STI) process to form shallow trenches and fill it with oxide. Deep trenches, or variations of the deeptype and shallow-type trenches, are used as well. Trench isolation is often used to separate diffusion regions in a MOS-based device. While the particular structure of a given active device can vary between device types, in MOS transistors, an active device generally includes source and drain regions and a gate electrode that modulates current between the source and drain regions. A trench isolation region is often used to separate one active area from the others.

Trenches are typically formed in the silicon through the use of well-known photolithography and etching techniques. In advanced, deep-submicron manufacturing processes, an important objective of the etching process is to terminate the etching at a precise depth, and this is readily achieved using a conventional endpoint detection system. When etching one film on top of a different film, the amount of light for one particular wavelength emitted by the plasma changes as the top film is being etched away. This wavelength of light corresponds to one of the products during the plasma etch process. The endpoint detection system is used to detect the changes of that one particular length of the light during the plasma etching process. There are two conditions that apply to such an endpoint detection system: the film on the top to be etched has finite thickness relative to the etchrate of the film; and there is another film of a different type underneath the film to be etched. Therefore, as the top film is being etched away, the products change and this, in turn, changes the amount of the light emitted by those products. As a result, the endpoint detection system can pick up the changes in the intensity of the light and terminate the etching process when the top film is completely etched away.

Etching an isolation trench is more difficult. When etching an isolation trench, the film to be etched is typically the silicon substrate which is several millimeters thick. Also, there is not another film underneath. So for the trench etch (shallow or deep), there is no endpoint detection system available to terminate the etching process. The common method to stop the etch process at a precise depth is to tightly control the etchrate. But etchrates usually fluctuate from day to day, and also after a major clean, such as a wet clean. To control the depth of the trench, the operator must often perform an etchrate check before processing a lot, and then adjust the etch time accordingly when the etchrate changes.

Accordingly, there has been a long-standing need for semiconductor structures, and manufacturing processes therefore, that overcome the aforementioned disadvantages of the prior art.

SUMMARY

According to various aspects of the present invention, embodiments thereof are exemplified in the form of methods and arrangements for fabricating semiconductor structure using a buried, oxygen-rich layer as a stop in a trench etch process. One specific implementation is directed to a process of fabricating a semiconductor device. The process involves applying a mask to protect selected portions of a silicon-based substrate; using the mask to implant an oxygen-based substance into other portions of the silicon-based substrate and forming a buried oxygen layer at a selected depth within the silicon-based substrate; and using the same mask to etch said other portions of the silicon-based substrate, the etch terminating upon reaching the buried oxygen layer.

In a more specific implementation, the above process includes removing the buried oxygen layer after completion of the etch process.

The above summary is not intended to provide an overview of all aspects of the present invention. Other aspects of the present invention are exemplified and described in connection with the detailed description.

BRIEF DESCRIPTION OF THE DRAWINGS

Various aspects and advantages of the present invention will become apparent upon reading the following detailed description of various embodiments and upon reference to the drawings in which.

Figure 1:
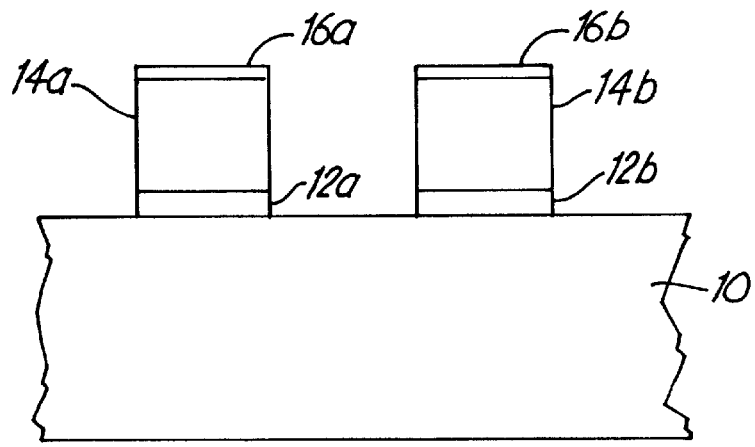
FIGS. 1–4 illustrate a process for forming a semiconductor structure, according to one example embodiment of the present invention.

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention may be applied to a variety of semiconductor structures and has been found to be particularly advantageous for use in connection with forming trenches used in device isolation applications such as isolation of active areas. While the present invention is not so limited, an appreciation of various aspects of the invention may be obtained through a discussion of various application examples in such an environment.

According to one example embodiment of the present invention, a process of fabricating a semiconductor structure uses a buried, oxygen-rich layer as a stop in a trench etch process. The process involves applying a mask to protect selected portions of a silicon-based substrate and using the mask to implant an oxygen-based substance into other portions of the silicon-based substrate. A buried oxygen layer is then implanted at a selected depth within the silicon-based substrate. The other portions of the silicon-based substrate are etched to form one or more trenches. In a predicted manner, the etching terminates at the buried oxygen layer. In a more particular embodiment, the process is self-aligned in that the mask that is used for forming a buried oxygen layer is also used for etching the other portions of the silicon-based substrate.

Turning now to the figures, FIG. 1 illustrates a silicon substrate 10, having formed thereon vertical structures, each including a pad oxide layer 12a, 12b, over the silicon substrate 10, a silicon nitride structure 14a, 14b, and a diffusion mask layer 16a and 16b, over the silicon nitride structure 14a, 14b. Each of the steps used in forming the vertical structures of the FIG. 1 is conventional. For example, the pad oxide layer 12a, 12b, is formed using a conventional thermal oxidation process and the silicon nitride layer 14a, 14b is formed using a conventional deposition process. Further, the diffusion mask 16a, 16b, can be formed using a conventional photolithography process. Alternatively, the diffusion mask 16a, 16b, can be formed by depositing a thin oxide layer, followed by conventional photolithography and etch processes to form an oxide film on the surface of the nitride structure 14a, 14b. The diffusion mask 16a, 16b, is used at this stage to etch back the silicon nitride and thereby form the vertical structures.

Figure 2:
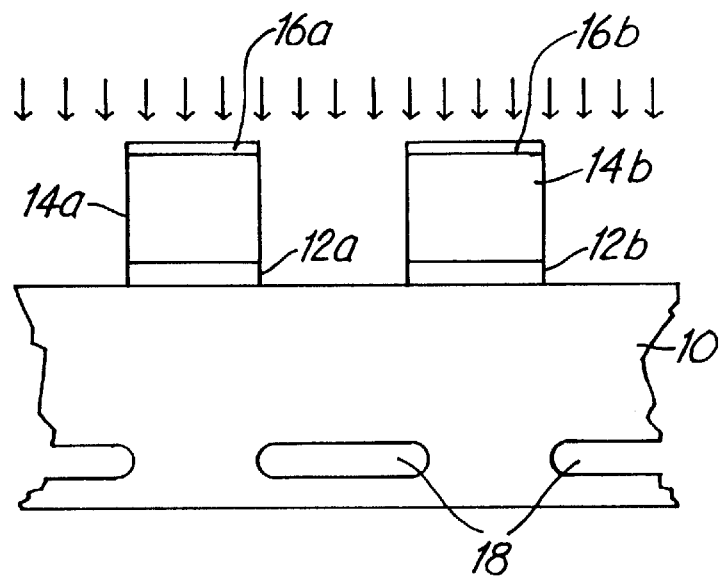

FIG. 2 illustrates the structure of FIG. 1 after additional processing, in accordance with an example with limitations of the present invention. As indicated by the downwardly-directed arrows, an oxygen ion implant will be used to create a buried etch stop layer 18 within the silicon substrate 10. In one example implementation in accordance with the present invention, the oxygen ion implant uses the same diffusion mask layer 16a, 16b, that is used for the silicon nitride etch. In this manner, the buried etch stop layer 18 is formed as part of a self-aligned silicon trench process. Alternatively, a separate mask can be used for the oxygen ion implant.

In a specific example embodiment, according to the present invention, the depth of the oxygen concentration peak can be adjusted by controlling the implant energy. For example, to form the depth of 3078 Angstroms for the buried etch stop layer, the ion energy is 140 keV. This depth is measured from the upper surface of the silicon substrate 10 to the center of the buried etch stop layer 18.

Figure 3:
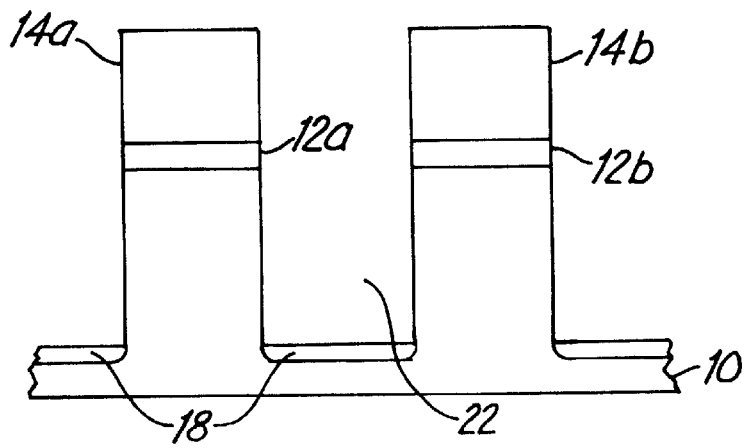

Referring now to FIG. 3, the structure of FIG. 1 is shown at yet a further point in the manufacturing process. A diffusion mask, layer 16a, 16b, will be removed by, for example, using dry or wet etch techniques, before the trench etch process used in forming the trenches 22, as shown in FIG. 3. During the trench etch process, the plasma reactions are mainly for removing the silicon substrate. Very little oxygen is involved in the reaction. Near the end of the process, when all the silicon on top of the buried implanted oxygen-rich layer is etched away, this oxygen-rich buried etch stop layer 18 will start to be etched.

The plasma reaction at this point is mainly to remove this oxygen-rich silicon layer. The oxygen implanted early will be involved in the reaction. By monitoring the wavelength for oxygen-related plasma reaction, the endpoint of the process can be accurately controlled by detecting a change of the intensity of the corresponding reflective light.

Figure 4:
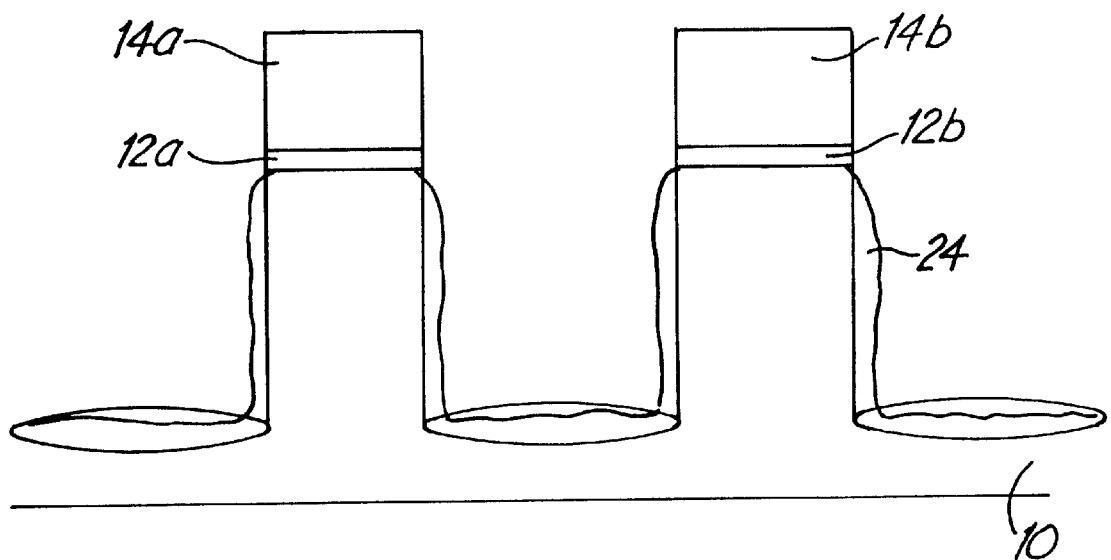

FIG. 4 illustrates the structure of FIG. 3, including a liner oxidation 24. During the liner oxidation process, the unetched implanted oxygen atoms form silicon dioxide. In this manner, the process is self-healing. Accordingly, during the liner oxidation, the previously implanted oxygen atoms combine with the silicon atoms to form silicon dioxide.

Included herewith is a table, depicted as Table 1A and 1B, that illustrates simulation data showing the ion energy versus depth of an oxygen peak for oxygen implanted into silicon substrate, and longitudinal and lateral straggling, according to an example embodiment of the present invention.

Accordingly, the present invention provides a structure having trenches formed using a buried etch stop layer that releases an agent, such as oxygen, during a trench process to trigger an endpoint detection for the trench etching. The various implementations of the invention can be used, for example, in advanced deep sub-micron semiconductor manufacturing processes, to precisely control the depth of the trench without performing an etch rate check before processing each lot, or requiring adjustment of the etch time when the etch rate changes.

The various embodiments described above are provided by way of illustration only and are not intended to limit the invention. Those skilled in the art will readily recognize various modifications and changes that may be made to the present invention without strictly following the example embodiments and applications illustrated and described herein. The scope of the present invention is set forth in the following claims.

What is claimed is:

1. A process of fabricating a semiconductor device, comprising:

providing a silicon substrate;

applying a mask to protect portions of the silicon substrate and providing unmasked portions not protected by the mask;

using the mask to implant an oxygen-based substance into the unmasked portions of the silicon substrate and forming a buried oxygen layer at a depth within the silicon substrate; and using the same mask to plasma etch the unmasked portions of the silicon substrate, the plasma etch automatically terminating in response to reaching the buried oxygen layer.

2. A process of fabricating a semiconductor device, according to claim 1, wherein the process further includes removing the buried oxygen layer.

3. A process of fabricating a semiconductor device, according to claim 1, wherein using the mask to implant an oxygen-based substance includes ion-implanting oxygen.

4. A process of fabricating a semiconductor device, according to claim 1, wherein the oxygen-based substance consists of oxygen and wherein oxygen from the buried oxygen layer releases into the plasma and causes the automatic etch termination.

5. A process of fabricating a semiconductor device, according to claim 1, wherein the depth within the silicon substrate is about 3000 Angstroms.

6. A process of fabricating a semiconductor device, according to claim 1, wherein the selected depth within the silicon substrate is set to about 3000 Angstroms by controlling an energy level used to implant the oxygen-based substrate.

7. A process of fabricating a semiconductor device, according to claim 1, wherein, in response to reaching the buried oxygen layer, oxygen from the buried oxygen layer releases into the plasma and causes the automatic etch termination.

8. A process of fabricating a semiconductor device, comprising:

providing a silicon substrate;

applying a mask to protect portions of the silicon substrate and providing unmasked portions not protected by the mask;

using the mask to implant an oxygen-based substance into the unmasked portions of the silicon substrate and forming a buried oxygen layer at a depth within the silicon-based substrate; and using the same mask to etch the unmasked portions of the silicon substrate, the etch automatically terminating in response to reaching the buried oxygen layer.

9. A process of fabricating a semiconductor device, comprising:

providing a silicon substrate;

applying a mask to protect portions of the silicon substrate and providing unmasked portions not protected by the mask;

using the mask to implant an oxygen-based substance into the unmasked portions of the silicon substrate and forming a buried oxygen layer at a depth within the silicon substrate;

using the same mask to etch the unmasked portions of the silicon substrate, wherein the etch automatically terminates in response to reaching the buried oxygen layer; and removing the buried oxygen layer.

10. A process of fabricating a semiconductor device, according to claim 9, wherein using the same mask to etch the unmasked portions of the silicon substrate includes using a plasma etch.

11. A process of fabricating a semiconductor device, according to claim 10, wherein, in response to reaching the buried oxygen layer, oxygen from the buried oxygen layer releases into the plasma and causes the automatic etch termination.

* * * * *

UNITED STATES PATENT AND TRADEMARK OFFICE
CERTIFICATE OF CORRECTION

PATENT NO. : 6,110,794　　　　　　　　　　　　　　　　　　　　　　　　Page 1 of 1
DATED : August 29, 2000
INVENTOR(S) : Liu It is certified that error appears in the above-identified patent and that said Letters Patent is hereby corrected as shown below:

Column 5,
Line 10, delete "-based".

Signed and Sealed this

Eighteenth Day of December, 2001

Attest:

JAMES E. ROGAN
*Attesting Officer*　　　*Director of the United States Patent and Trademark Office*